United States Patent
Zeng et al.

(10) Patent No.: US 11,764,809 B2
(45) Date of Patent: Sep. 19, 2023

(54) INFORMATION PROCESSING METHOD AND APPARATUS

(71) Applicant: Huawei Technologies Co., Ltd., Shenzhen (CN)

(72) Inventors: Xiaofei Zeng, Shenzhen (CN); Lei Jing, Wuhan (CN); Lun Zhang, Dongguan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/930,523

(22) Filed: Sep. 8, 2022

(65) Prior Publication Data

US 2023/0006698 A1   Jan. 5, 2023

Related U.S. Application Data

(63) Continuation of application No. PCT/CN2021/077772, filed on Feb. 25, 2021.

(30) Foreign Application Priority Data

Mar. 10, 2020 (CN) .......................... 202010161558.3

(51) Int. Cl.
*H03M 13/00* (2006.01)
*H03M 13/21* (2006.01)
*H04L 1/00* (2006.01)

(52) U.S. Cl.
CPC ......... *H03M 13/21* (2013.01); *H03M 13/613* (2013.01); *H04L 1/0045* (2013.01)

(58) Field of Classification Search
None
See application file for complete search history.

(56) References Cited

U.S. PATENT DOCUMENTS

| | | | |
|---|---|---|---|
| 2007/0143645 A1 | 6/2007 | Haran | |
| 2010/0098413 A1 | 4/2010 | Li et al. | |
| 2010/0122121 A1* | 5/2010 | Krishnamurthy | H04W 24/02 714/707 |
| 2013/0318423 A1* | 11/2013 | Jagmohan | G06F 11/1008 714/E11.032 |

(Continued)

FOREIGN PATENT DOCUMENTS

| CN | 101183913 A | 5/2008 |
|---|---|---|
| CN | 101635610 A | 1/2010 |

(Continued)

*Primary Examiner* — Mujtaba M Chaudry
(74) *Attorney, Agent, or Firm* — Slater Matsil, LLP

(57) ABSTRACT

An information processing apparatus includes: a decoding module, configured to receive M first codewords from at least one peer device, where each first codeword includes first service data with a K-unit length and an error correction code with an R-unit length, where the decoding module is further configured to decode the M first codewords to obtain M second codewords, where a length of each second codeword is a sum of the K-unit length and the R-unit length, each second codeword includes second service data with the K-unit length and error correction information, the second service data is error-corrected first service data; and a classification and statistics collection module, configured to determine a bit error rate of the first service data based on the error correction information.

20 Claims, 7 Drawing Sheets

(56) References Cited

U.S. PATENT DOCUMENTS

| | | | |
|---|---|---|---|
| 2015/0092894 A1 | 4/2015 | Yokokawa et al. | |
| 2015/0242260 A1* | 8/2015 | Hassan | H04L 1/20 714/48 |
| 2016/0299844 A1* | 10/2016 | Sprouse | G06F 12/0246 |
| 2017/0353193 A1* | 12/2017 | Jang | H03M 13/2906 |
| 2018/0219561 A1* | 8/2018 | Litsyn | H03M 13/2915 |
| 2018/0234115 A1* | 8/2018 | Noh | H04L 1/0064 |
| 2018/0270017 A1* | 9/2018 | Lin | H03M 13/3746 |
| 2018/0343020 A1* | 11/2018 | Kumar | G06F 11/1076 |
| 2019/0138390 A1* | 5/2019 | Fisher | H03M 13/2924 |
| 2019/0312679 A1* | 10/2019 | Jayasinghe | H04L 1/0038 |
| 2020/0373944 A1* | 11/2020 | Cho | G06F 11/1048 |
| 2021/0306005 A1* | 9/2021 | Sheiman | H03M 13/13 |

FOREIGN PATENT DOCUMENTS

| | | |
|---|---|---|
| CN | 101739306 A | 6/2010 |
| JP | 2013016883 A | 1/2013 |
| WO | 2011022886 A1 | 3/2011 |

\* cited by examiner

INFORMATION PROCESSING METHOD AND APPARATUS

CROSS-REFERENCE TO RELATED APPLICATIONS

This application is a continuation of International Application No. PCT/CN2021/077772, filed on Feb. 25, 2021, which claims priority to Chinese Patent Application No. 202010161558.3, filed on Mar. 10, 2020. The disclosures of the aforementioned applications are hereby incorporated by reference in their entireties.

TECHNICAL FIELD

This application relates to the field of communication technologies, and in particular, to an information processing method and apparatus.

BACKGROUND

In a digital communication system, a signal received by a receiving device is distorted due to factors such as noise and crosstalk introduced in a transmission channel, and further, a system bit error is caused. To avoid or reduce the system bit error, forward error correction (FEC) is widely used in the digital communication system. However, due to a reason such as a limitation of a size, power consumption, or costs, when an FEC decoding module and a classification and recognition module are two different components, the receiving device cannot determine error correction information corresponding to service data of each peer device. Consequently, transmission efficiency of the error correction information is affected, and data processing efficiency is low.

SUMMARY

An embodiment of this application provides an information processing apparatus, to improve transmission efficiency of error correction information and improve data processing efficiency.

According to a first aspect, an embodiment of this application provides an information processing apparatus. The apparatus includes a decoding module and a classification and statistics collection module. The decoding module is configured to receive M first codewords from at least one peer device, where each first codeword includes first service data with a K-unit length and an error correction code with an R-unit length, and M, K, and R are all integers greater than or equal to 1. The decoding module is further configured to decode the M first codewords to obtain M second codewords, where a length of each second codeword is a sum of the K-unit length and the R-unit length, each second codeword includes second service data with the K-unit length and error correction information, the second service data is error-corrected first service data, and the error correction information is error statistics information obtained after error correction is performed on the first service data with the K-unit length based on the error correction code with the R-unit length. The classification and statistics collection module is configured to determine a bit error rate of the first service data based on the error correction information.

In this embodiment, when the decoding module and the classification and statistics collection module are two independent components, the decoding module combines the decoded service data and the error correction information into a second codeword and transmits the second codeword to the classification and statistics collection module, so that the classification and statistics collection module can perform classification and statistics collection on the error correction information and the service data corresponding to the error correction information. Therefore, in a transmission process, no processing needs to be performed on the error correction information. This not only improves transmission efficiency of the error correction information, but also improves data processing efficiency.

In a possible design, a valid length of the error correction information is less than or equal to the R-unit length. Therefore, it is ensured that all the error correction information can be written into the codeword without changing the length of the codeword.

In another possible design, when the valid length of the error correction information is less than the R-unit length, a part other than the second service data with the K-unit length and the error correction information in each second codeword is an invalid padding code, so that integrity of the codeword is ensured.

In another possible design, the classification and statistics collection module is further configured to collect statistics on second codewords of a same peer device among the M second codewords based on a peer device corresponding to each second codeword. Classification and statistics collection are performed on second codewords of each peer device, so that classification and calculation are performed on the service data of each peer device. Therefore, transmission efficiency of the service data is ensured for each peer device.

In another possible design, the classification and statistics collection module is further configured to perform classification processing on each second codeword to separately obtain the second service data with the K-unit length and the error correction information. Classification and statistics collection are performed on the second service data and the error correction information, and further, a transmission status of the service data is determined by using the error correction information. Therefore, transmission efficiency of the service data is ensured.

In another possible design, the error correction information includes a first quantity of error data in the first service data with the K-unit length in each first codeword; and the classification and statistics collection module is further configured to determine the bit error rate of the first service data with the K-unit length based on the first quantity and the K-unit length. Because a bit error rate of each codeword is calculated, a transmission status of the codeword is determined, and service data transmission efficiency is ensured.

In another possible design, the error correction information includes a first quantity of error data in the first service data with the K-unit length in each first codeword; and the classification and statistics collection module is further configured to count a second quantity of error data in the M first codewords based on the first quantity of error data in each first codeword, and determine a bit error rate of all service data in the M first codewords based on the second quantity, the K-unit length, and M. Because the bit error rate of all the codewords is calculated, a transmission status of all the codewords is determined, and service data transmission efficiency is ensured.

According to a second aspect, an embodiment of this application provides an information processing method. The information processing method is completed by the foregoing decoding module, to perform the method and function performed by the decoding module in the first aspect.

According to a third aspect, an embodiment of this application provides an information processing method. The information processing method is completed by the foregoing classification and statistics collection module, to perform the method and function performed by the classification and statistics collection module in the first aspect.

According to a fourth aspect, an embodiment of this application provides an information processing apparatus. The information processing apparatus is configured to implement the method and function performed by the decoding module in the second aspect. The information processing apparatus is implemented by hardware/software, and the hardware/software of the information processing apparatus includes a unit corresponding to the foregoing function.

According to a fifth aspect, an embodiment of this application provides an information processing apparatus. The information processing apparatus is configured to implement the method and function performed by the classification and statistics collection module in the third aspect. The information processing apparatus is implemented by hardware/software, and the hardware/software of the information processing apparatus includes a unit corresponding to the foregoing function.

According to a sixth aspect, an embodiment of this application provides a receiving device, including a processor and a communication interface. Optionally, the receiving device may further include a memory. The communication interface is configured to implement connection and communication between the processor and the memory. The processor executes a program stored in the memory, to implement the steps performed by the information processing apparatus in the first aspect.

In a possible design, the receiving device provided in this application may include a module corresponding to a behavior of the receiving device in the foregoing method design. The module may be software and/or hardware.

According to a seventh aspect, this application provides a computer-readable storage medium. The computer-readable storage medium stores instructions, and when the instructions are run on a computer, the computer is enabled to perform the method according to the foregoing aspects.

According to an eighth aspect, this application provides a computer program product including instructions. When the computer program product runs on a computer, the computer is enabled to perform the method according to the foregoing aspects.

According to a ninth aspect, an embodiment of this application provides a chip. The chip includes a processor and a communication interface. The processor is coupled to the communication interface, and configured to implement the methods provided in the foregoing aspects.

Optionally, the chip may further include a memory. For example, the processor may read and execute a software program stored in the memory, to implement the methods provided in the foregoing aspects. Alternatively, the memory may not be included in the chip, but may be located outside the chip. This means that the processor can read and execute a software program stored in an external memory, to implement the methods provided in the foregoing aspects.

BRIEF DESCRIPTION OF THE DRAWINGS

To describe technical solutions in embodiments or the background of this application more clearly, the following describes the accompanying drawings used in embodiments or the background of this application.

DETAILED DESCRIPTION OF ILLUSTRATIVE EMBODIMENTS

The following describes embodiments of this application with reference to the accompanying drawings in embodiments of this application.

Figure 1:
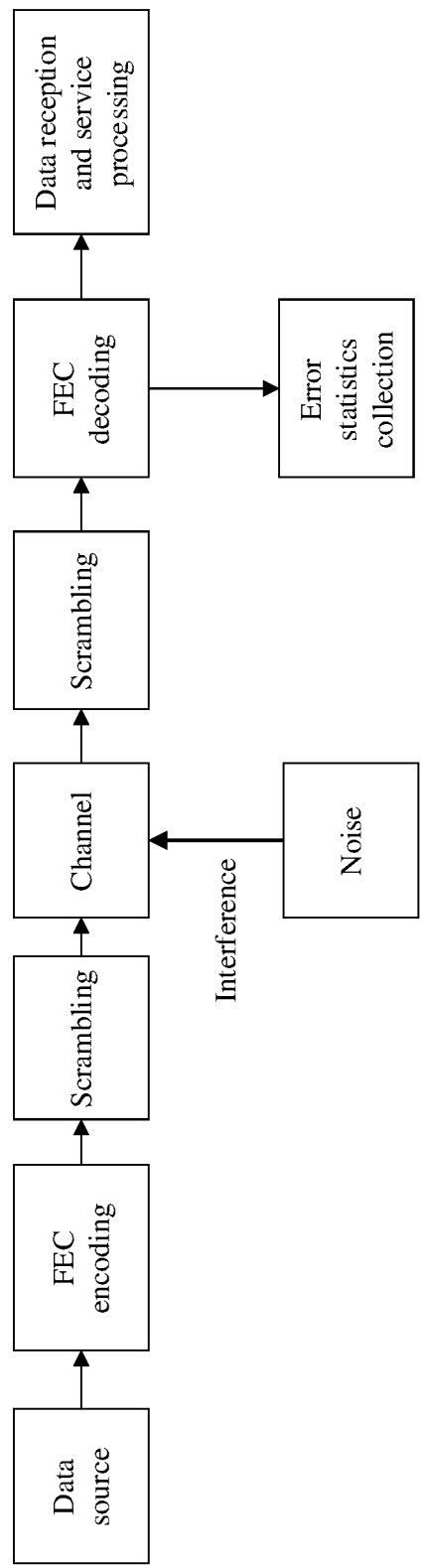
FIG. 1 is a schematic diagram of a communication system model according to an embodiment of this application.

FIG. 1 is a schematic diagram of a communication system model according to an embodiment of this application. The communication system model includes the following: First, a peer device performs FEC encoding, scrambling, and the like on a source signal, and then sends encoded data to a receiving device through channel transmission. The receiving device obtains decoded data by performing descrambling and decoding. The decoded data includes error correction information and service data. Error statistics collection and service processing are performed on the error correction information and the service data respectively.

Figure 2:
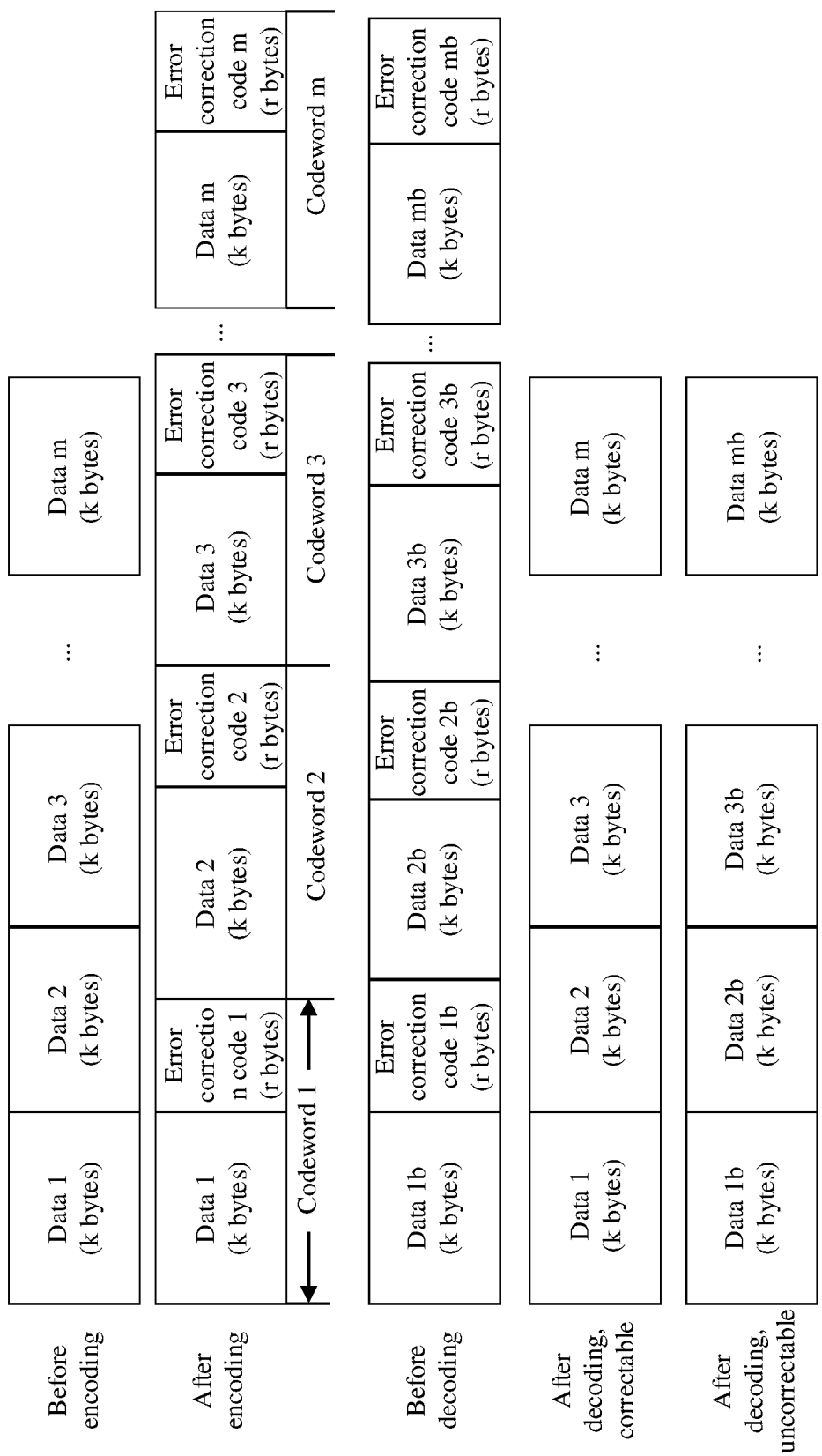
FIG. 2 is a schematic diagram of a data stream before and after FEC encoding and decoding according to an embodiment of this application.

FIG. 2 is a schematic diagram of a data stream before and after FEC encoding and decoding according to an embodiment of this application. Before FEC encoding is performed on service data, the service data includes service data 1, service data 2, service data 3, . . . , and service data m, and a length of each piece of service data is k bytes. After FEC encoding is performed on each piece of service data, an error correction code is added after each piece of service data, where the error correction code may also be referred to as a redundancy code or a check code, and a length of each error correction code is r bytes. In this way, data with a length of k+r bytes is formed. The data with the length of k+r bytes may be used as one codeword. Therefore, m codewords are obtained. Lengths of k and r are related to specific FEC encoding. For example, in RS(255, 239), k=239 bytes, and r=16 bytes.

After the m codewords are transmitted through a channel, a bit error may exist or data content changes. Therefore, when the m codewords pass through an FEC decoder, the error correction code is used to check the service data. If it is determined that an error exists in the service data, error data in the service data is corrected, the error correction code is removed, and the service data with a length of k bytes is restored. In some cases, service data in a last codeword may not have a length of k bytes, and a length of restored service data may be less than k bytes. If the error data in the service data exceeds a preset threshold, an error correction capability is exceeded. In this case, error correction does not need to be performed, and the r-byte error correction code is separated, to keep the k-byte service data unchanged.

In the foregoing process, after the receiving device receives the m codewords sent by the peer device, the m codewords need to separately pass through an FEC decoding module and a classification and statistics collection module. The FEC decoding module is configured to decode the m codewords, and after decoding is completed, obtain error correction information of each of the m codewords, where the error correction information may include a quantity of error data in service data in each codeword or a quantity of corrected error data. The classification and statistics collection module may be configured to accumulate the quantity of error data based on the error correction information, for example, error data in a plurality of codewords or a plurality of bit streams, or collect statistics on service data based on different services.

In a point-to-point continuous scenario, for example, a continuous bit stream, error correction information statistics are simple and can be continuously accumulated. However, in a time division multiplexing (TDM) passive optical network (PON) system, error correction information statistics are relatively complex. The TDM PON may include a gigabit passive optical network (GPON), an Ethernet passive optical network (EPON), a 10-gigabit passive optical network (XG-PON), a 10-gigabit symmetric passive optical network (XGS-PON), an Ethernet passive optical network (10G EPON), or the like.

Figure 3:
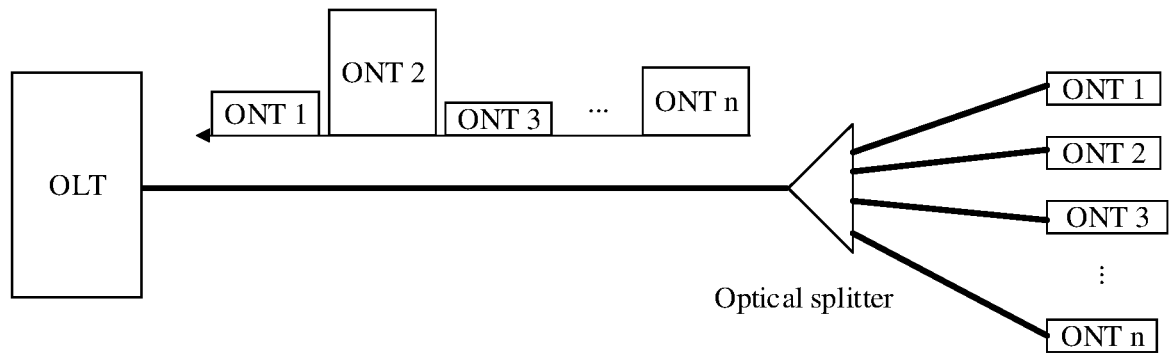
FIG. 3 is a schematic diagram of a TDM PON transmission system according to an embodiment of this application.

For example, FIG. 3 is a schematic diagram of a TDM PON transmission system according to an embodiment of this application. The system includes a plurality of optical network terminals (ONT), an optical line terminal (OLT), and an optical splitter. The ONT may also be an optical network unit (ONU). In an uplink direction, the plurality of ONTs (for example, an ONT 1, an ONT 2, an ONT 3, . . . , and an ONT n) send data to the OLT in different timeslots by using the optical splitter. In a downlink direction, the OLT sends data to the plurality of ONTs by using the optical splitter. Each ONT receives data sent by the OLT and extracts data that belongs to the ONT. For a plurality of codewords sent in each timeslot, the OLT needs to collect statistics on error correction information based on different ONTs. For a same ONT, a plurality of codewords may be sent in different timeslots. Therefore, it is necessary to collect cumulative statistics on error correction information in the plurality of codewords in different timeslots.

Figure 4:
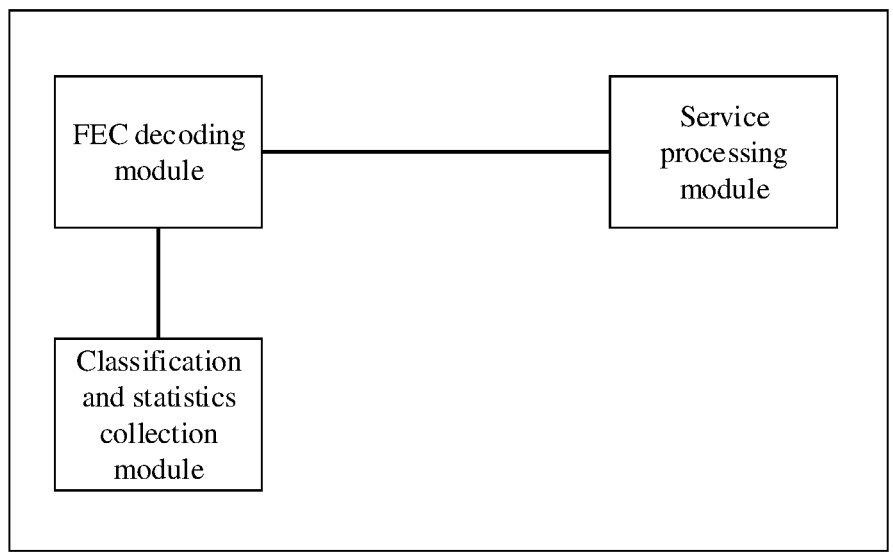
FIG. 4 is a schematic diagram of an OLT hardware system according to an embodiment of this application.

FIG. 4 is a schematic diagram of an OLT hardware system according to an embodiment of this application. An OLT internally includes an FEC decoding module, a classification and statistics collection module, and a service processing module. The FEC decoding module is configured to decode a plurality of received codewords. The classification and statistics collection module is configured to separately collect statistics on error correction information based on different ONTs. The service processing module is configured to process service data in the plurality of received codewords. If the FEC decoding module, the classification and statistics collection module, and the service processing module are all in a same chip, information is transmitted within the chip, there is a correspondence between the error correction information collected by the classification and statistics collection module and the service data processed by the service processing module, and statistics collection performed on error correction information for service data in each codeword may be relatively simple. If the FEC decoding module and the classification and statistics collection module are two different components (which may be understood as different boards or modules in a device, or may be understood as different devices), because the error correction information is based on the codewords, the FEC decoding module cannot determine a specific ONT to which each codeword belongs, and there is no correspondence between the error correction information obtained through decoding by the FEC decoding module and the service data. If error correction information of each ONT needs to be collected, the error correction information needs to be processed. This is relatively complex, affects transmission efficiency of the error correction information, and causes low data processing efficiency. To resolve the foregoing technical problems, embodiments of this application provide the following solutions.

Figure 5:
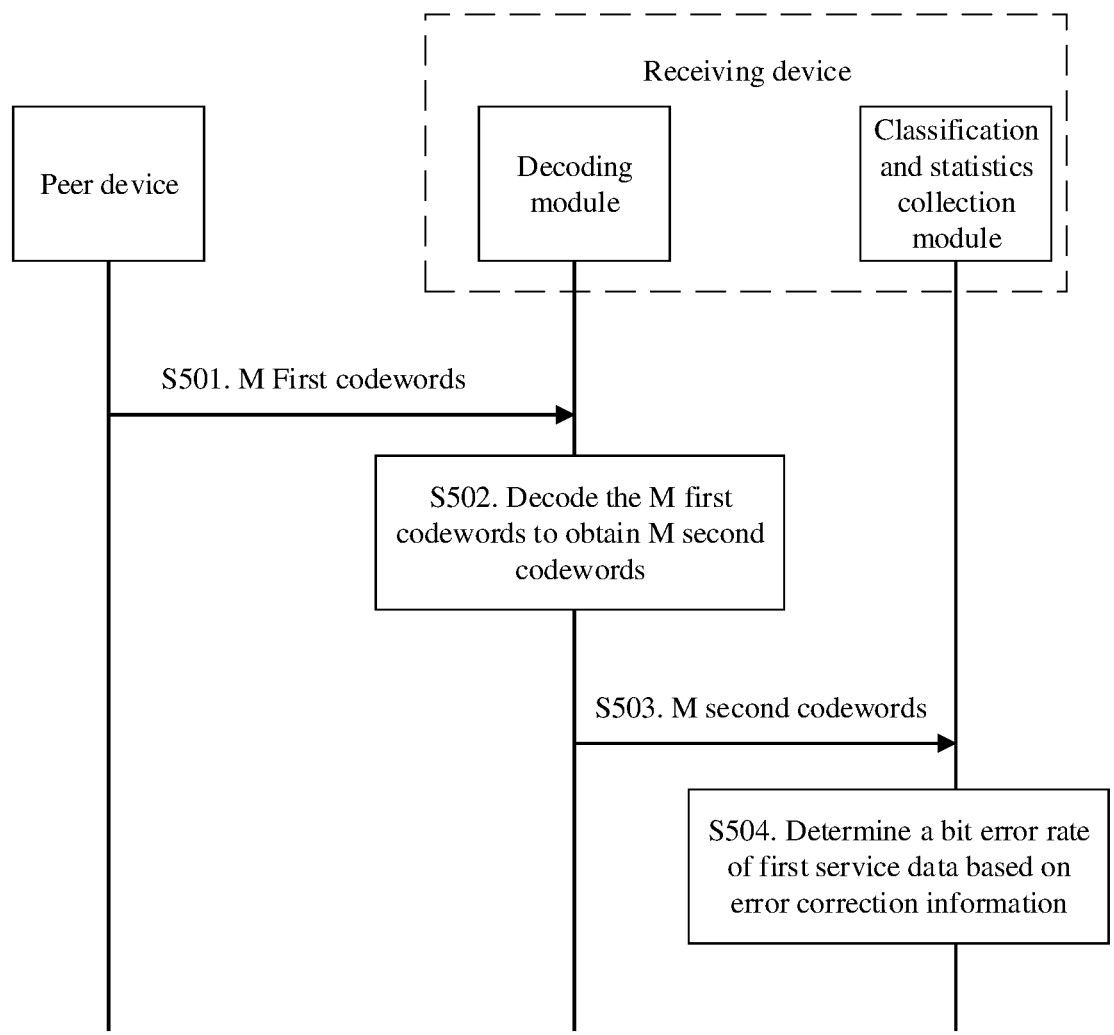
FIG. 5 is a schematic flowchart of an information processing method according to an embodiment of this application.

FIG. 5 is a schematic flowchart of an information processing method according to an embodiment of this application. A receiving device includes a decoding module and a classification and statistics collection module, and the method includes but is not limited to the following steps.

S501. A decoding module receives M first codewords from at least one peer device, where each first codeword includes first service data with a K-unit length and an error correction code with an R-unit length, and M, K, and R are all integers greater than or equal to 1. The unit length may be a byte, a bit, or the like.

Figure 6:
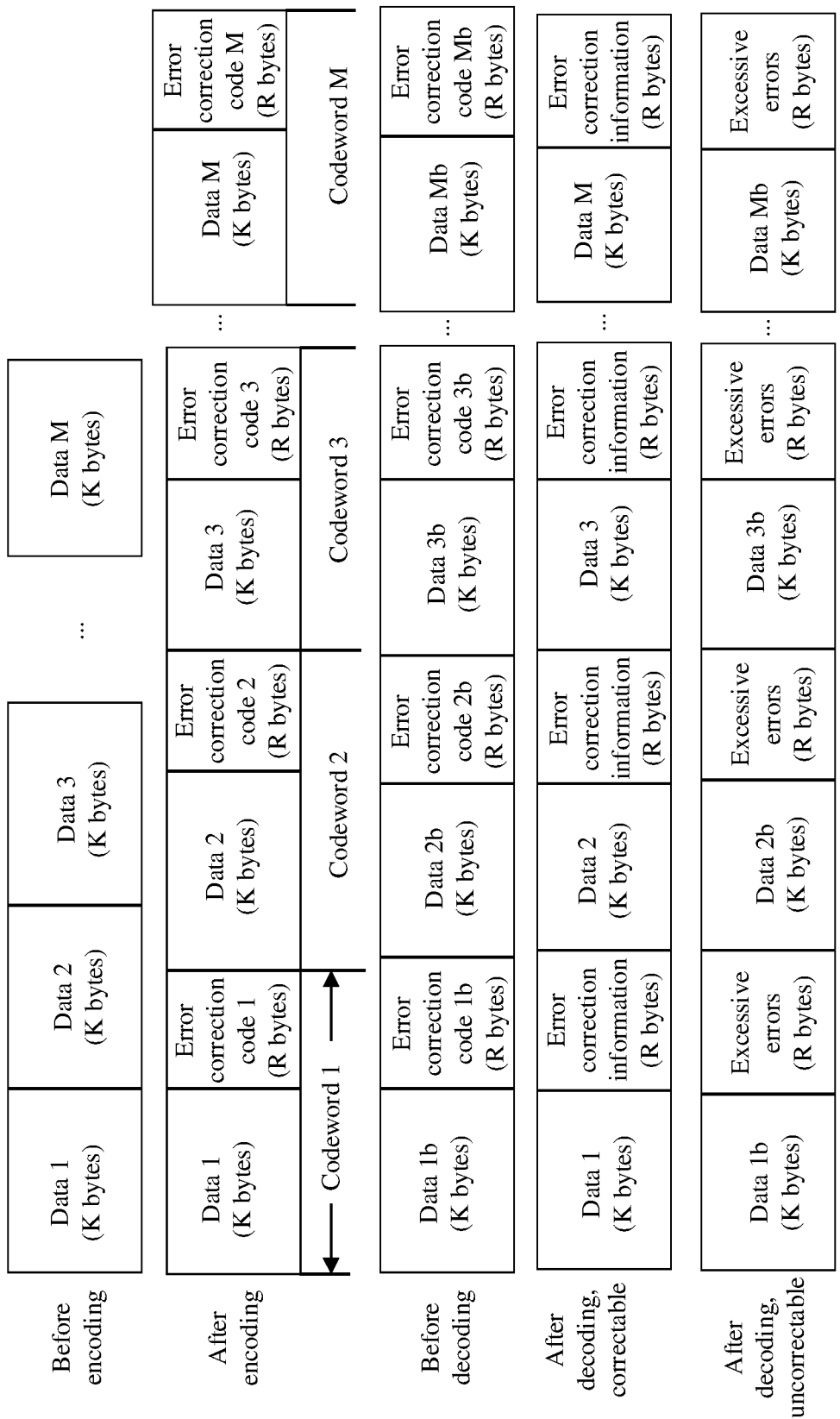
FIG. 6 is a schematic diagram of another data stream before and after FEC encoding and decoding according to an embodiment of this application.

In a specific implementation, each peer device may first encode service data. For example, as shown in FIG. 6, service data before encoding by the peer device includes service data 1, service data 2, service data 3, . . . , and service data M, and a length of each piece of service data is K bytes. M codewords are obtained after the service data is encoded. For example, a codeword 1 includes service data 1 and an error correction code 1, a codeword 2 includes service data 2 and an error correction code 2, . . . , and a codeword M includes service data M and an error correction code M. Each codeword includes K-byte service data and an R-byte error correction code. The error correction code may also be referred to as a redundancy code or a check code.

Then the peer device sends the encoded M codewords to the receiving device. After the encoded M codewords are transmitted through a channel, a bit error may exist or data content may change. Therefore, M first codewords received by the receiving device are different from the M codewords sent by the peer device. As shown in FIG. 6, on a receiving device side, before decoding, a first codeword 1 includes service data 1b and a check code 1b, a first codeword 2 includes service data 2b and a check code 2b, . . . , and a last first codeword includes service data Mb and a check code Mb. The first codewords are different from the M codewords sent by the peer device.

S502. The decoding module decodes the M first codewords to obtain M second codewords, where a length of each second codeword is a sum of the K-unit length and the R-unit length, each second codeword includes second service data with the K-unit length and error correction information, the second service data is error-corrected first service data, and the error correction information is error statistics information obtained after error correction is performed on the first service data with the K-unit length based on the error correction code with the R-unit length.

In a specific implementation, in a decoding process, by using the error correction code in each first codeword, the decoding module performs error correction on the first service data in the first codeword to obtain second service data, and counts a quantity of error data in the first service data or a quantity of corrected data in the first service data in the first codeword, to generate error correction information, where the error correction information includes at least one of the quantity of error data or the quantity of corrected data. If the quantity of error data in the first service data in the first codeword exceeds a preset threshold, an error correction capability of the decoding module is exceeded. In this case, the first service data in each first codeword is kept unchanged. The error correction information may be identification information, and the identification information is used to indicate that the error correction capability is exceeded.

After the error correction information and the second service data are obtained by decoding each first codeword, the error correction information and the second service data are not separated, but the error correction information and the second service data are combined to form a second codeword. A length of the second codeword is the same as a length of the first codeword, and both are a (K+R)-unit length. A length of the second service data in the second codeword and a length of the first service data in the first codeword are the same, and both are a K-unit length. A valid length of the error correction information is less than or equal to the R-unit length.

Further, if the valid length of the error correction information is equal to the R-unit length, the error correction information is written into all spatial locations of remaining R bytes in the second codeword. If the valid length of the error correction information is less than the R-unit length, the error correction information needs to occupy only a part of spatial locations of the remaining R-unit length in the second codeword. Therefore, an invalid padding code may be written into another part of spatial locations of the remaining R-unit length, and a part other than the second service data with the K-unit length and the error correction information in each second codeword is an invalid padding code. The invalid padding code may be 0, 1, 1010, or another agreed invalid bit stream.

Optionally, locations of the second service data, the error correction information, and the invalid padding code in the second codeword are not fixed. For example, the second codeword may sequentially include the second service data, the error correction information, and the invalid padding code, or may sequentially include the second service data, the invalid padding code, and the error correction information. Other cases are similar and are not described herein.

As shown in FIG. 6, when a decoding capability of the decoding module is satisfied, the receiving device decodes the M first codewords to obtain the M second codewords, where a second codeword 1 after decoding includes K-byte service data 1 and error correction information, a second codeword 2 after decoding includes K-byte service data 2 and error correction information, . . . , and a last second codeword after decoding includes K-byte service data M and error correction information. When the decoding capability of the decoding module is exceeded, the service data in each first codeword is kept unchanged, and after decoding, the service data in the second codeword is still the service data 1b, the service data 2b, . . . , and the service data Mb. The service data is the same as that in the first codeword. The error correction information may be identification information used to identify excessive errors.

It should be noted that the service data in the last codeword among the M first codewords may not have a K-unit length. Therefore, a length of the service data in the last codeword among the M second codewords obtained through decoding is less than or equal to the K-unit length.

S503. The decoding module sends the M second codewords to a classification and statistics collection module.

Figure 7:
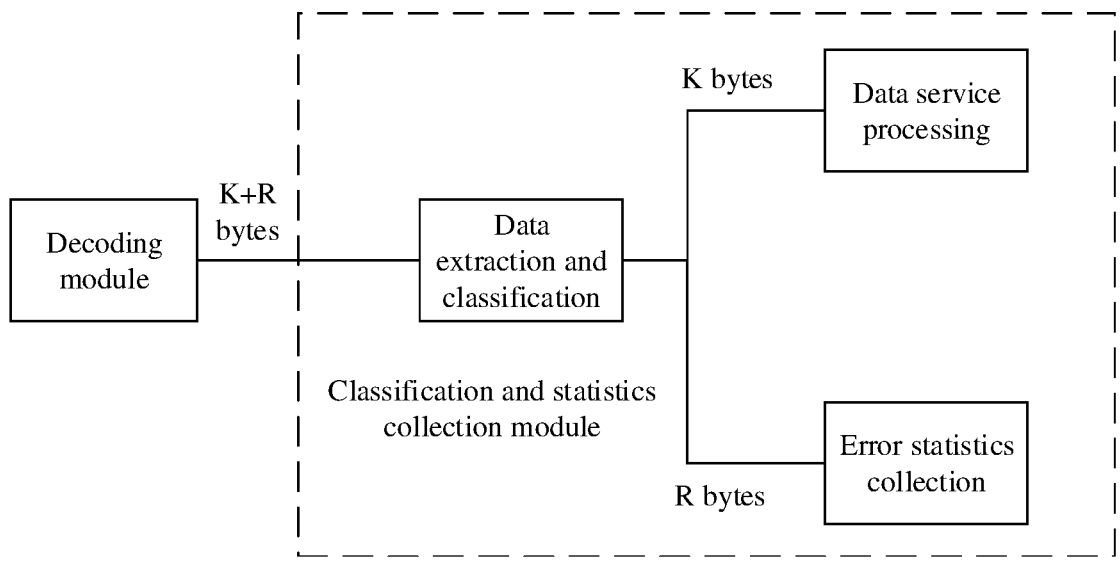
FIG. 7 is a schematic diagram of a structure of a receiving device according to an embodiment of this application.

FIG. 7 is a schematic diagram of a structure of a receiving device according to an embodiment of this application. The receiving device includes a decoding module and a classification and statistics collection module. The decoding module and the classification and statistics collection module are two independent components. The decoding module decodes the M first codewords to obtain the M second codewords, and then transmits the M second codewords to the classification and statistics collection module that is mutually independent of the decoding module. After receiving the M second codewords, the classification and statistics collection module performs classification processing on each second codeword to separately obtain second service data with the K-unit length and error correction information. If the second codeword includes the second service data with the K-unit length and the error correction information with the R-unit length, the second service data with the K-unit length and the error correction information with the R-unit length may be obtained separately after the classification processing. Because the second service data with the K-unit length and the error correction information with the R-unit length in the second codeword are classified within a same component, after the second service data with the K-unit length and the error correction information with the R-unit length are transmitted by using different channels, a correspondence exists, and cumulative calculation of the error correction information is performed based on the correspondence.

S504. The classification and statistics collection module determines a bit error rate of the first service data based on the error correction information.

In an implementation, a bit error rate of the service data is determined for each first codeword. The error correction information includes a first quantity of error data in the first service data with the K-unit length in each first codeword; and the classification and statistics collection module may determine the bit error rate of the first service data with the K-unit length based on the first quantity and the K-unit length. Further, the first quantity is divided by the K-unit length to obtain the bit error rate.

In another implementation, a bit error rate of the service data is determined for all the M first codewords. The error correction information includes a first quantity of error data in the first service data with the K-unit length in each first codeword; and the classification and statistics collection module counts a second quantity of error data in the M first codewords based on the first quantity of error data in each first codeword, and then determines a bit error rate of all service data in the M first codewords based on the second quantity, the K-unit length, and M. Further, a product of the K-unit length and M may be calculated, and then the second quantity is divided by the product to obtain the bit error rate of all the service data in the M first codewords.

In another implementation, a bit error rate of the service data is determined for first codewords sent by a same peer device. The M first codewords include first codewords sent by N target peer devices. The classification and statistics collection module counts a second quantity of error data in the N first codewords based on a first quantity of error data in each of the N first codewords, and then determines a bit error rate of all service data in the N first codewords based on the second quantity, the K-unit length, and N. Further, a product of the K-unit length and N may be calculated, and then the second data is divided by the product to obtain the bit error rate of all the service data in the N first codewords.

It should be noted that a manner of collecting statistics on the bit error rate includes but is not limited to the foregoing manner. Alternatively, another manner may be used to collect statistics on the bit error rate of the service data.

Optionally, the classification and statistics collection module may collect statistics on second codewords of a same peer device among the M second codewords based on a peer device corresponding to each second codeword. For example, the M second codewords include a codeword 1, a codeword 2, . . . , and a codeword 6, and peer devices include a device 1 and a device 2. The codeword 1, the codeword 2, and the codeword 6 belong to the device 1. The codeword 3, the codeword 4, and the codeword 5 belong to the device 2.

As shown in FIG. 3, for the GPON system, a downlink frame includes a payload part, the payload part includes a plurality of general encapsulation methods (GEM) frames, and each GEM frame includes a GEM header. The GEM header includes a port identifier (port ID), and the port ID corresponds to a service stream of each ONT. An uplink frame includes a physical control frame header (PLOu) field and a payload field. The PLOu field includes an ONU ID, and the ONU ID is used to indicate an ONT to which a first codeword belongs. The payload field also includes a GEM header, the GEM header includes a port identifier (port ID), and the port ID corresponds to a service stream of each ONT. Therefore, the second codewords of the same peer device among the M second codewords may be counted based on the port ID or the ONU ID.

Optionally, other information in a data stream, for example, a media access control (MAC) address, or a serial number (SN), or a virtual local area network (VLAN) identifier (ID), may be used to collect statistics on the second codewords of the same peer device among the M second codewords. The method is the same as the foregoing method, and details are not described herein again.

It should be noted that this embodiment of this application may be applied not only to the PON system, but also to another system. The method is applied not only to uplink transmission but also to downlink transmission.

In this embodiment of this application, when the decoding module and the classification and statistics collection module are two independent components, the decoding module combines the decoded service data and the error correction information into a second codeword and transmits the second codeword to the classification and statistics collection module, so that the classification and statistics collection module can perform classification and statistics collection on the error correction information and the service data corresponding to the error correction information. Therefore, in a transmission process, no processing needs to be performed on the error correction information. This not only improves transmission efficiency of the error correction information, but also improves data processing efficiency.

Figure 8:
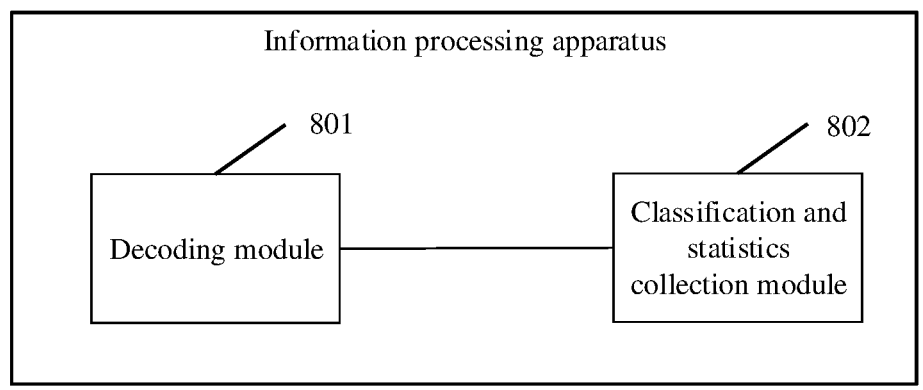
FIG. 8 is a schematic diagram of a structure of an information processing apparatus according to an embodiment of this application.

FIG. 8 is a schematic diagram of a structure of an information processing apparatus according to an embodiment of this application. The information processing apparatus may include a decoding module 801 and a classification and statistics collection module 802. Detailed descriptions of the modules are as follows.

The decoding module 801 is configured to receive M first codewords from at least one peer device, where each first codeword includes first service data with a K-unit length and an error correction code with an R-unit length, and M, K, and R are all integers greater than or equal to 1.

The decoding module 801 is further configured to decode the M first codewords to obtain M second codewords, where a length of each second codeword is a sum of the K-unit length and the R-unit length, each second codeword includes second service data with the K-unit length and error correction information, the second service data is error-corrected first service data, and the error correction information is error statistics information obtained after error correction is performed on the first service data with the K-unit length based on the error correction code with the R-unit length.

The classification and statistics collection module 802 is configured to determine a bit error rate of the first service data based on the error correction information.

Optionally, a valid length of the error correction information is less than or equal to the R-unit length.

Optionally, when the valid length of the error correction information is less than the R-unit length, a part other than the second service data with the K-unit length and the error correction information in each second codeword is an invalid padding code.

Optionally, the classification and statistics collection module 802 is further configured to collect statistics on second codewords of a same peer device among the M second codewords based on a peer device corresponding to each second codeword.

Optionally, the classification and statistics collection module 802 is further configured to perform classification processing on each second codeword to separately obtain the second service data with the K-unit length and the error correction information.

Optionally, the error correction information includes a first quantity of error data in the first service data with the K-unit length in each first codeword; and the classification and statistics collection module 802 is further configured to determine the bit error rate of the first service data with the K-unit length based on the first quantity and the K-unit length.

Optionally, the error correction information includes a first quantity of error data in the first service data with the K-unit length in each first codeword; and the classification and statistics collection module 802 is further configured to count a second quantity of error data in the M first codewords based on the first quantity of error data in each first codeword, and determine a bit error rate of all service data in the M first codewords based on the second quantity, the K-unit length, and M.

It should be noted that, for implementation of each module, reference may be made to the corresponding description of the method embodiment shown in FIG. 5. Each module performs the method and function performed by the receiving device in the foregoing embodiment.

Figure 9:
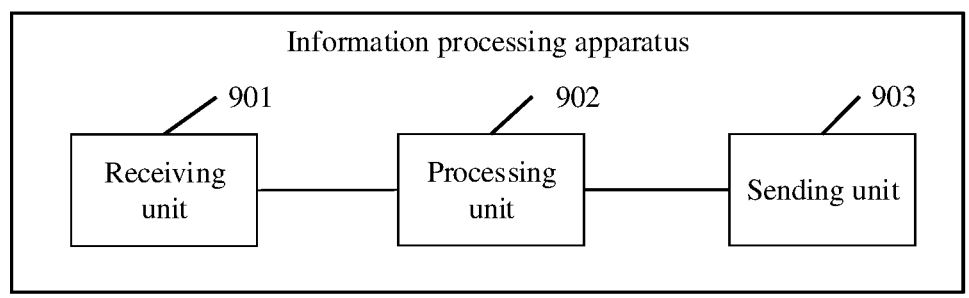
FIG. 9 is a schematic diagram of a structure of another information processing apparatus according to an embodiment of this application.

FIG. 9 is a schematic diagram of a structure of another information processing apparatus according to an embodiment of this application. The information processing apparatus is, for example, the foregoing decoding module. The decoding module may include a receiving unit 901, a processing unit 902, and a sending unit 903. Detailed descriptions of the units are as follows.

The receiving unit 901 is configured to receive M first codewords from at least one peer device, where each first codeword includes first service data with a K-unit length and an error correction code with an R-unit length, and M, K, and R are all integers greater than or equal to 1.

The processing unit 902 is configured to decode the M first codewords to obtain M second codewords, where a length of each second codeword is a sum of the K-unit length and the R-unit length, each second codeword includes second service data with the K-unit length and error correction information, the second service data is error-corrected first service data, and the error correction information is error statistics information obtained after error correction is performed on the first service data with the K-unit length based on the error correction code with the R-unit length.

A valid length of the error correction information is less than or equal to the R-unit length.

When the valid length of the error correction information is less than the R-unit length, a part other than the second service data with the K-unit length and the error correction information in each second codeword is an invalid padding code.

Optionally, the sending unit 903 is configured to send the M second codewords to a second information processing apparatus.

It should be noted that, for implementation of each module, reference may be made to the corresponding description of the method embodiment shown in FIG. 5. Each module performs the method and function performed by the decoding module in the foregoing embodiment.

Figure 10:
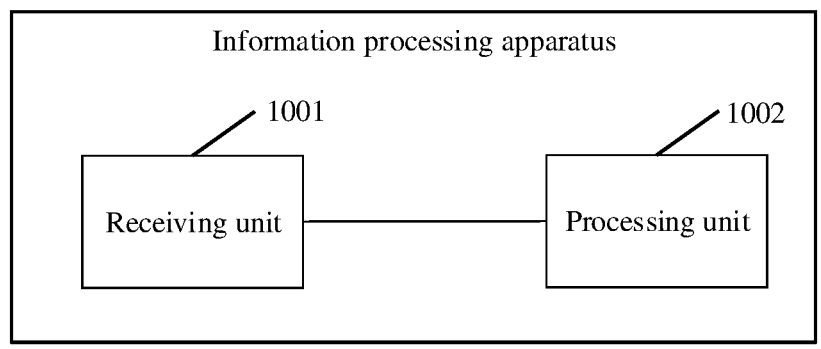
FIG. 10 is a schematic diagram of a structure of another information processing apparatus according to an embodiment of this application.

FIG. 10 is a schematic diagram of a structure of another information processing apparatus according to an embodiment of this application. The information processing apparatus is, for example, the classification and statistics collection module. The classification and statistics collection module may include a receiving unit 1001 and a processing unit 1002. Detailed descriptions of the units are as follows.

The receiving unit 1001 is configured to receive M second codewords sent by a first information processing apparatus, where a length of each second codeword is a sum of a K-unit length and an R-unit length, each second codeword includes second service data with the K-unit length and error correction information, the second service data is error-corrected first service data, the error correction information is error statistics information obtained after error correction is performed on first service data with the K-unit length based on an error correction code with the R-unit length in each of M first codewords, and M, K, and R are all integers greater than or equal to 1.

The processing unit 1002 is configured to determine a bit error rate of the first service data based on the error correction information.

Optionally, the processing unit 1002 is further configured to perform classification processing on each second codeword to separately obtain the second service data with the K-unit length and the error correction information.

Optionally, the error correction information includes a first quantity of error data in the first service data with the K-unit length in each first codeword; and the processing unit 1002 determines the bit error rate of the first service data with the K-unit length based on the first quantity and the K-unit length.

Optionally, the error correction information includes a first quantity of error data in the first service data with the K-unit length in each first codeword; and the processing unit 1002 is further configured to count a second quantity of error data in the M first codewords based on the first quantity of error data in each first codeword, and determine a bit error rate of all service data in the M first codewords based on the second quantity, the K-unit length, and M.

Optionally, the processing unit 1002 is further configured to collect statistics on second codewords of a same peer device among the M second codewords based on a peer device corresponding to each second codeword.

It should be noted that, for implementation of each module, reference may be made to the corresponding description of the method embodiment shown in FIG. 5. Each module performs the method and function performed by the classification and statistics collection module in the foregoing embodiment.

Figure 11:
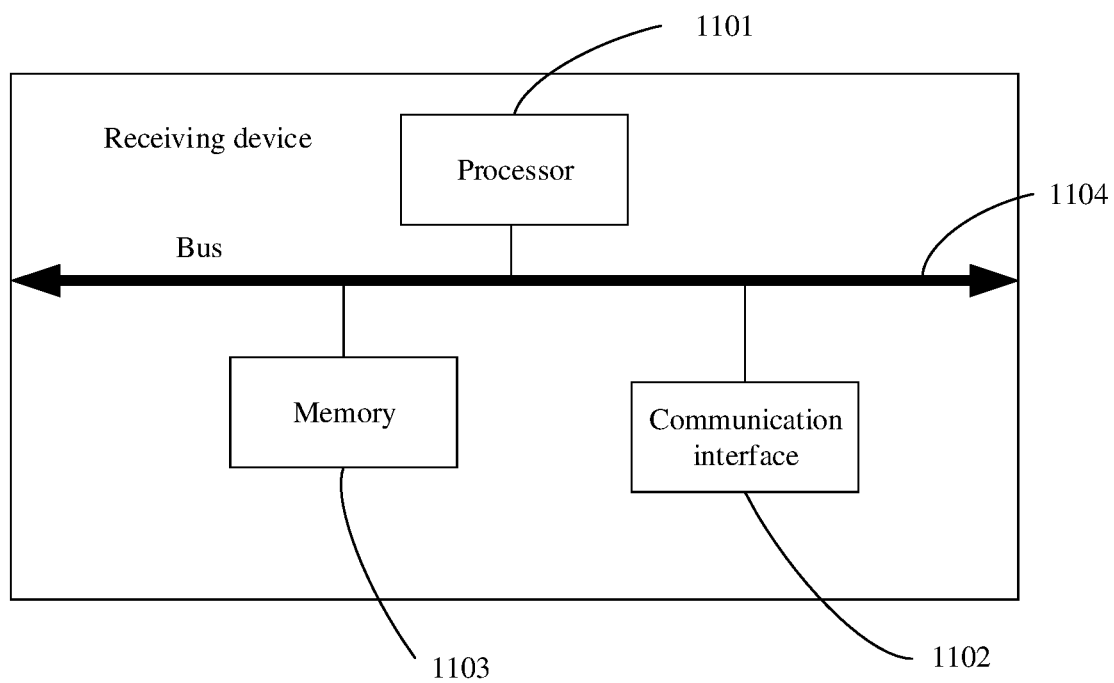
FIG. 11 is a schematic diagram of a structure of another receiving device according to an embodiment of this application.

FIG. 11 is a schematic diagram of a structure of another receiving device according to an embodiment of this application. As shown in FIG. 11, the receiving device may include at least one processor 1101 and at least one communication interface 1102. Optionally, the receiving device may further include at least one memory 1103 and at least one communication bus 1104. For example, the processor 1101 may include the foregoing decoding module and the foregoing classification and statistics collection module to separately perform the methods and functions performed by the decoding module and the classification and statistics collection module in the foregoing embodiments.

The processor 1101 may be a central processing unit, a general-purpose processor, a digital signal processor, an application-specific integrated circuit, a field programmable gate array or another programmable logic device, a transistor logic device, a hardware component, or any combination thereof. The processor may implement or execute various example logical blocks, modules, and circuits described with reference to content disclosed in this application. Alternatively, the processor may be a combination of processors implementing a computing function, for example, a combination including one or more microprocessors, or a combination of a digital signal processor and a microprocessor. The communication bus 1104 may be a peripheral component interconnect standard PCI bus, an extended industry standard architecture EISA bus, or the like. The bus may be classified into an address bus, a data bus, a control bus, and the like. For ease of representation, only one thick line is used for representation in FIG. 11, but it does not mean that there is only one bus or one type of bus. The communication bus 1104 is configured to implement connection and communication between these components. The communication interface 1102 of the device in this embodiment of this application is configured to perform signaling or data communication with another node device. The memory 1103 may include a volatile memory, a phase change random access memory (phase change RAM, PRAM), or a magnetoresistive random access memory (magnetoresistive RAM, MRAM), and may further include a nonvolatile memory, for example, at least one magnetic disk storage device, an electronically erasable programmable read-only memory (EEPROM), a flash memory device, for example, an NOR flash memory, or a NAND flash memory, or a semiconductor device, such as a solid-state drive (SSD). Optionally, the memory 1103 may be at least one storage apparatus located away from the processor 1101. Optionally, the memory 1103 may further store a group of program code, and optionally, the processor 1101 may further execute the program stored in the memory 1103 to perform the following: receiving M first codewords from at least one peer device, where each first codeword includes first service data with a K-unit length and an error correction code with an R-unit length, and M, K, and R are all integers greater than or equal to 1; decoding the M first codewords to obtain M second codewords, where a length of each second codeword is a sum of the K-unit length and the R-unit length, each second codeword includes second service data with the K-unit length and error correction information, the second service data is error-corrected first service data, and the error correction information is error statistics information obtained after error correction is performed on the first service data with the K-unit length based on the error correction code with the R-unit length; and determining a bit error rate of the first service data based on the error correction information.

A valid length of the error correction information is less than or equal to the R-unit length.

When the valid length of the error correction information is less than the R-unit length, a part other than the second service data with the K-unit length and the error correction information in each second codeword is an invalid padding code.

Optionally, statistics collection is performed on second codewords of a same peer device among the M second codewords based on a peer device corresponding to each second codeword.

Optionally, classification processing is performed on each second codeword to separately obtain the second service data with the K-unit length and the error correction information.

Optionally, the error correction information includes a first quantity of error data in the first service data with the K-unit length in each first codeword; and the bit error rate of the first service data with the K-unit length is determined based on the first quantity and the K-unit length.

Optionally, the error correction information includes a first quantity of error data in the first service data with the K-unit length in each first codeword; and a second quantity of error data in the M first codewords is counted based on the first quantity of error data in each first codeword, and a bit error rate of all service data in the M first codewords is determined based on the second quantity, the K-unit length, and M.

Further, the processor may further cooperate with the memory and the communication interface to perform operations of the receiving device in the foregoing embodiments of this application.

All or some of the foregoing embodiments may be implemented by using software, hardware, firmware, or any combination thereof. When software is used to implement embodiments, all or some of embodiments may be implemented in a form of a computer program product. The computer program product includes one or more computer instructions. When the computer program instructions are loaded and executed on a computer, all or some of the procedures or the functions according to embodiments of this application are generated. The computer may be a general-purpose computer, a dedicated computer, a computer network, or another programmable apparatus. The computer instructions may be stored in a computer-readable storage medium, or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, microwave, or the like) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid-state drive solid-state drive (SSD)), or the like.

The objectives, technical solutions, and beneficial effects of this application are further described in detail in the foregoing specific implementations. Any modification, equivalent replacement, or improvement made without departing from the spirit and principle of this application shall fall within the protection scope of this application.

What is claimed is:

1. A method, comprising:
    receiving M first codewords from at least one peer device, wherein each first codeword of the M first codewords comprises first service data with a K-unit length and an error correction code with an R-unit length, and M, K, and R are all integers greater than or equal to 1; and
    decoding the M first codewords to obtain M second codewords, wherein a length of each second codeword is a sum of the K-unit length and the R-unit length of the corresponding first codeword, each second codeword comprises second service data with the K-unit length of the corresponding first codeword and error correction information of the corresponding first codeword, the second service data is error-corrected first service data of the corresponding first codeword, and the error correction information is error statistics information obtained after error correction is performed on the first service data with the K-unit length of the corresponding first codeword based on the error correction code with the R-unit length of the corresponding first codeword.

2. The method according to claim 1, wherein a valid length of the error correction information of each second codeword is less than or equal to the R-unit length of the corresponding first codeword.

3. The method according to claim 2, wherein, for each second codeword, when the valid length of the error correction information of the respective second codeword is less than the R-unit length of the corresponding first codeword, a part other than the second service data with the K-unit length and the error correction information of the respective second codeword is an invalid padding code.

4. The method according to claim 3, wherein the M second codewords includes a first second codeword, and the first second codeword sequentially includes respective second service data, respective error correction information, and a respective invalid padding code.

5. The method according to claim 3, wherein the M second codewords includes a first second codeword, and the first second codeword sequentially includes respective second service data, a respective invalid padding code, and respective error correction information.

6. The method according to claim 1, further comprising:
    determining a bit error rate of the first service data based on the M second codewords.

7. A method, comprising:
    receiving M second codewords, wherein a length of each second codeword of the M second codewords is a sum of a K-unit length and an R-unit length, each second codeword comprises second service data with the K-unit length of the corresponding second codeword and error correction information, the second service data of each second codeword is error-corrected first service data of a corresponding first codeword of M first codewords, the error correction information of each second codeword is error statistics information obtained after error correction is performed on first service data with the K-unit length based on an error correction code with the R-unit length in a corresponding first codeword of the M first codewords, and M, K, and R are all integers greater than or equal to 1; and determining a bit error rate of the first service data of each first codeword based on the error correction information of each second codeword.

8. The method according to claim 7, further comprising: performing classification processing on each second codeword to separately obtain the second service data with the K-unit length and the error correction information of the respective second codeword.

9. The method according to claim 7, wherein the error correction information of each second codeword comprises a first quantity of error data in the first service data with the K-unit length in the corresponding first codeword; and wherein determining the bit error rate of the first service data of each first codeword based on the error correction information of each second codeword comprises:

determining the bit error rate of the first service data with the K-unit length of the corresponding first codeword based on the first quantity and the K-unit length of the corresponding first codeword.

10. The method according to claim 7, wherein the error correction information comprises a first quantity of error data in the first service data with the K-unit length in each first codeword; and wherein determining the bit error rate of the first service data of each first codeword based on the error correction information of each second codeword comprises:

counting a second quantity of error data in the M first codewords based on the first quantity of error data in each first codeword; and determining a bit error rate of all service data in the M first codewords based on the second quantity, the K-unit length, and M.

11. The method according to claim 7, further comprising: collecting statistics on second codewords of a same peer device among the M second codewords based on a peer device corresponding to each second codeword.

12. The method according to claim 7, wherein, for each second codeword, a valid length of the error correction information of the respective second codeword is less than or equal to the R-unit length of the respective second codeword.

13. The method according to claim 7, wherein, for each second codeword, when a valid length of the error correction information of the respective second codeword is less than the R-unit length of the corresponding first codeword, a part other than the second service data with the K-unit length and the error correction information of the respective second codeword is an invalid padding code.

14. An apparatus, comprising:
a receiver, configured to receive M second codewords sent by a second apparatus, wherein a length of each second codeword of the M second codewords is a sum of a K-unit length and an R-unit length of the corresponding second codeword, each second codeword comprises second service data with the K-unit length of the corresponding second codeword and error correction information, the second service data of each second codeword is error-corrected first service data of a corresponding first codeword of M first codewords, the error correction information of each second codeword is error statistics information obtained after error correction is performed on first service data with the K-unit length based on an error correction code with the R-unit length in a corresponding first codeword of the M first codewords, and M, K, and R are all integers greater than or equal to 1;

at least one processor; and a non-transitory computer readable storage medium storing a program that is executable by the at least one processor, the program including instructions to:

determine a bit error rate of the first service data of each first codeword based on the error correction information of each second codeword.

15. The apparatus according to claim 14, wherein the program further includes instructions to:

perform classification processing on each second codeword to separately obtain the second service data with the K-unit length and the error correction information of the respective second codeword.

16. The apparatus according to claim 14, wherein the error correction information of each second codeword comprises a first quantity of error data in the first service data with the K-unit length in a corresponding first codeword; and the program further includes instructions to:

determine the bit error rate of the first service data with the K-unit length of the corresponding first codeword based on the first quantity and the K-unit length of the corresponding first codeword.

17. The apparatus according to claim 14, wherein the error correction information of each second codeword comprises a first quantity of error data in the first service data with the K-unit length in the corresponding first codeword; and wherein the program further includes instructions to:

count a second quantity of error data in the M first codewords based on the first quantity of error data in each first codeword; and determine a bit error rate of all service data in the M first codewords based on the second quantity, the K-unit length, and M.

18. The apparatus according to claim 14, wherein the program further includes instructions to:

collect statistics on second codewords of a same peer device among the M second codewords based on a peer device corresponding to each second codeword.

19. The apparatus according to claim 14, wherein, for each second codeword, a valid length of the error correction information of the respective second codeword is less than or equal to the R-unit length of the respective second codeword.

20. The apparatus according to claim 14, wherein, for each second codeword, when a valid length of the error correction information of the respective second codeword is less than the R-unit length of the corresponding first codeword, a part other than the second service data with the K-unit length and the error correction information of the respective second codeword is an invalid padding code.

* * * * *